(12) United States Patent
Ninomiya et al.

(10) Patent No.: US 7,155,816 B2
(45) Date of Patent: Jan. 2, 2007

(54) METHOD FOR PRODUCING A MULTILAYER CERAMIC SUBSTRATE

(75) Inventors: Hideaki Ninomiya, Tokyo (JP); Haruo Nishino, Tokyo (JP); Kiyoshi Hatanaka, Tokyo (JP)

(73) Assignee: TDK Corporation, Tokyo (JP)

( * ) Notice: Subject to any disclaimer, the term of this patent is extended or adjusted under 35 U.S.C. 154(b) by 209 days.

(21) Appl. No.: 10/354,972

(22) Filed: Jan. 31, 2003

(65) Prior Publication Data

US 2004/0089472 A1    May 13, 2004

(30) Foreign Application Priority Data

Feb. 1, 2002    (JP)    ............... 2002-025632

(51) Int. Cl.
*H05K 3/36* (2006.01)
(52) U.S. Cl. .................. 29/830; 29/846; 29/25.41; 29/432; 156/89.12; 156/312; 438/109; 438/125; 428/325
(58) Field of Classification Search .................. 29/846, 29/830, 609, 602.1, 25.41, 432; 156/89.11, 156/89.12, 103, 244.27, 312; 438/109, 121, 438/125; 428/293.4, 325; 361/320, 321.1
See application file for complete search history.

(56) References Cited

U.S. PATENT DOCUMENTS

| | | | | |
|---|---|---|---|---|
| 5,643,818 A | * | 7/1997 | Sachdev et al. | ......... 438/125 X |
| 2001/0022416 A1 | | 9/2001 | Harada et al. | |

FOREIGN PATENT DOCUMENTS

| | | | | |
|---|---|---|---|---|
| JP | 2-32595 | * | 2/1990 | .................. 29/846 |
| JP | 2-208915 | * | 8/1990 | .............. 361/321.1 |
| JP | 7-221454 | | 8/1995 | |
| JP | 9-181449 | | 7/1997 | |
| JP | 2870476 | | 3/1999 | |
| JP | 11-186448 | | 7/1999 | |
| JP | 2001-135933 | | 5/2001 | |
| JP | 2001-156454 | | 6/2001 | |
| JP | 2001-230548 | | 8/2001 | |
| JP | 2001-267448 | | 9/2001 | |
| JP | 2001-339166 | | 12/2001 | |

OTHER PUBLICATIONS

Mater et al., "Cosintering Process for Glass-Ceramic/Copper Multilayer Ceramic Substrate", IEEE Transactions on Component Hybrids, and Manufacturing Technology, vol. 14, No. 4, pp. 780-783, Dec. 1991.*

* cited by examiner

*Primary Examiner*—A. Dexter Tugbang
(74) *Attorney, Agent, or Firm*—Oblon, Spivak, McClelland, Maier & Neustadt, P.C.

(57) ABSTRACT

A method for producing a multilayer ceramic substrate having a cavity formed therein includes punching a through opening corresponding to the cavity in green sheets constituting a laminate, and printing a conductor at a predetermined position of the green sheets, laminating the green sheets to constitute a green sheet laminate, and applying a pressure to the green sheet laminate by using a compression member having a projection at a position corresponding to the cavity to thereby compress the green sheet laminate. The projection has a height which is equal to the depth of the cavity multiplied by compression ratio of the green sheet laminate, and the green sheet laminate is compressed by applying the pressure such that compression ratio of the bottom of the cavity is identical with the compression ratio of other parts of the green sheet laminate.

2 Claims, 5 Drawing Sheets

METHOD FOR PRODUCING A MULTILAYER CERAMIC SUBSTRATE

BACKGROUND OF THE INVENTION

1. Technical Field

This invention relates to a multilayer ceramic substrate and its production method. To be more specific, this invention relates to an improvement in a multilayer ceramic substrate having a cavity formed therein.

2. Background Art

FIG. 4 is a cross sectional view of a conventional multilayer ceramic substrate 1. In FIG. 4, the multilayer ceramic substrate 1 comprises a laminate of ceramic layers 1a, 1b, 1c, 1d, 1e, 1f, 1g, and 1h disposed one on another. This laminate has end surfaces on opposite ends in the thickness direction of the laminate, and the laminate is formed with a cavity 2 which opens to at least one end surface. The cavity 2 is adapted for accommodating a chip device (not shown) such as a semiconductor IC chip.

The laminate has wiring conductors at predetermined positions of the ceramic layers 1a to 1h. Exemplary such wiring conductors include an external conductor films 6 formed on the end surface of the laminate, an internal conductor films 3 formed along the some of the interfaces between the ceramic layers 1a to 1h, a via hole conductor (through hole) 4 formed to penetrate through some of the ceramic layer 1a to 1h.

The cavity 2 is formed by continuation of through opening formed in some consecutive ceramic layers of the ceramic layers 1a to 1h.

In producing the multilayer ceramic substrate 1 shown in FIG. 4, ceramic green sheets 1a, 1b, 1c, 1d, 1e, 1f, 1g, and 1h corresponding to the ceramic layer 1a to 1h are first produced, and then, the wiring conductors as described above, namely, the external conductor films 6, the internal conductor films 3, and the via hole conductors 4 are formed on the predetermined sheets of the ceramic green sheets 1a to 1h at the predetermined position. The through opening for the cavity 2 is also formed in the predetermined consecutive ceramic layers of the ceramic layers 1a to 1h.

After forming the through opening in the required ceramic green sheets, the ceramic green sheets 1a to 1h are overlaid one on another so that the opening of the cavity 2 formed by the continuation of the through openings is located at one end surface located at one end in the thickness direction of the laminate. A green sheet laminate is thereby produced.

The green sheet laminate 1 is then pressed in the thickness direction. The pressed green sheet laminate 1 is then fired to obtain the multilayer ceramic substrate 1 shown in FIG. 4.

However, when the green sheet laminate is simply pressed in thickness direction, inner periphery of the cavity 2 is likely to become swollen or collapsed due to the softness of the ceramic green sheets 1a to 1e. In addition, the bottom of the cavity 2 will escape the pressing, and the overall sheet laminate will not be pressed uniformly. In addition, the ceramic green sheets 1a to 1e is likely to become dislocated by slippage, and it is the top ceramic green sheet 1a that is most likely to become dislocated.

In order prevent such deformation of the cavity, the mold used for pressing may be provided with a projection which has a height corresponding to the depth of the cavity formed in the green sheet laminate, and the interior of the cavity may be compressed with this projection. However, overall compression ratio of the laminate will not be uniform even if the projection having a height identical with the depth of the cavity in the green sheet laminate were provided, since the stroke in the compression of the part of the laminate other than the part corresponding to the projection is large and this results in the increased compression ratio of the part of the green sheet laminate corresponding to the projection.

It is also quite difficult to provide the projection with a mechanism that would adjust the stroke or the compression ratio since such mechanism inevitably invites complication of the mold structure. Such complicated mechanism may be provided if only one cavity were to be formed. The mold used in mass production, however, is usually provided with a large number (typically about 400 to 600) of projections since many substrates are pressed at once, and provision of such complicated mechanism to all of the projections is not at all realistic in terms of the production convenience and the cost if such provision were not at all impossible.

Japanese Patent Application Laid-Open No. (JP-A) 2001-267448 and other documents recite isostatic pressing using an intervening elastic member to thereby apply a consistent pressure in the compression. It is, however, difficult to form corners of the cavity or corners of the substrate by such isostatic pressing using the intervening elastic member, and the deformation is likely to take place. Surface irregularity and waving is also likely to be found in the bottom of the cavity, and flip chip packaging of the device is difficult in such a case.

JP-A 2001-230548 discloses use of the so called "non-shrinking ceramic sheet". Use of such material, however, only prevents shrinkage of the substrate in lengthwise direction, and shrinkage in the thickness direction is not regulated. In this case, the L and/or C elements formed by the internal conductors are less likely to enjoy improved precision.

SUMMARY OF THE INVENTION

A feature of the present invention is to provide a multilayer ceramic substrate which has a consistent quality, which has no swelling or collapse in the inner periphery of the cavity, wherein the bottom of the cavity is flat to enable stable packaging of the desired device at a high precision, and wherein L and C can be formed by the internal conductor at a high precision.

Another feature of the present invention is to provide a method for producing a multilayer ceramic substrate and an apparatus therefor by which a multilayer ceramic substrate can be readily produced in a simple procedure by using an apparatus of simple structure.

Features as described above are realized by the present invention as described below.

(1) A multilayer ceramic substrate comprising a laminate constituted from laminated ceramic layers and internal conductors formed between the ceramic layers, wherein said laminate has end surfaces on opposite ends of its thickness direction, and said laminate is formed with a cavity which opens to at least one end surface of the laminate, and wherein said multilayer ceramic substrate is provided at least with a capacitor, an inductor, or a capacitor and an inductor constituted by said internal conductors.

(2) A multilayer ceramic substrate according to the above (1) wherein a pad is formed at the bottom of said cavity to thereby enable flip chip packaging, wire bonding, or die bonding of a device.

(3) A multilayer ceramic substrate according to the above (1) wherein the bottom of the cavity has a surface roughness or surface irregularity of up to 10 μm.

A multilayer ceramic substrate according to the above (1) wherein the capacitor, the inductor, or the capacitor and the inductor constituted by said internal conductors has a precision of up to ±5%.

(5) A method for producing a multilayer ceramic substrate having a cavity formed therein, comprising the steps of:

punching a through opening corresponding to the cavity in green sheets constituting a laminate, and printing a conductor at the predetermined position of the green sheets, and then laminating the green sheets to constitute a green sheet laminate;

applying a pressure which does not cause deformation of the cavity to the green sheet laminate to thereby adhere the green sheets of the green sheet laminate; and then applying a pressure of 30 to 150 MPa to the green sheet laminate by using a compression member having a projection at the position corresponding to said cavity to thereby compress the green sheet laminate.

(6) A method for producing a multilayer ceramic substrate according to the above (5) wherein said projection has a height which is equal to the depth of the cavity multiplied by compression ratio of the green sheet laminate.

(7) A method for producing a multilayer ceramic substrate according to the above (5) wherein the green sheet laminate is compressed by applying the pressure such that compression ratio of the bottom of the cavity is identical with the compression ratio of other parts of the green sheet laminate.

(8) A method for producing a multilayer ceramic substrate according to the above (5) wherein the cavity before the compression has a depth H is represented by the equation:

$$H = D \times (1/(1-a/100) \times (1-b/100) - 1/(1-b/100) + 1)$$

when the cavity after firing has a depth D, shrinkage ratio in the firing is a%, and compression ratio of the laminate is b%.

(9) An apparatus for producing a multilayer ceramic substrate wherein a green sheet laminate comprising a plurality of laminated green sheets is compressed by applying a pressure through a compression member, wherein said compression member is provided with a projection at the position corresponding to said cavity of the laminate.

(10) An apparatus for producing a multilayer ceramic substrate according to the above (9) wherein said projection has a height which is equal to the depth of the cavity multiplied by compression ratio of the green sheet laminate.

(11) An apparatus for producing a multilayer ceramic substrate according to the above (9) wherein clearance between said projection and the side surfaces of the cavity 2 is up to 60 μm.

DESCRIPTION OF THE PREFERRED EMBODIMENTS

Figure 1:
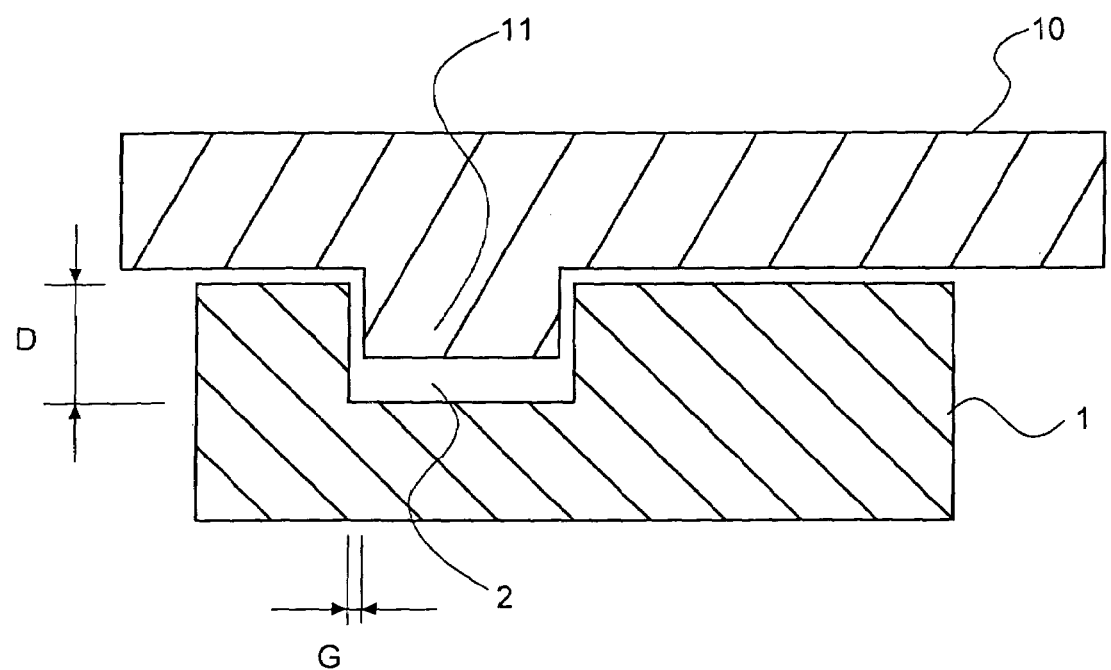
FIG. 1 is a cross sectional view showing the multilayer ceramic substrate according to an embodiment of the present invention in relation to the mold.

The multilayer ceramic substrate of the present invention comprises a laminate constituted from laminated ceramic layers and internal conductors formed between the ceramic layers. The laminate has end surfaces on opposite ends of its thickness direction, and said laminate is formed with a cavity which opens to at least one end surface of the laminate. The multilayer ceramic substrate is provided at least with a capacitor and/or an inductor constituted by said internal conductor.

Since a cavity of a high precision as well as a capacitor and/or an inductor of high precision which is formed by the internal conductor are provided in one substrate, the multilayer substrate produced has a small size and a reduced thickness, and production of an electronic device exhibiting excellent electric characteristics including the high frequency characteristics is enabled.

Formation of the cavity with no surface irregularities on its side or bottom surface at a high precision simultaneously with the formation of the interior capacitor and/or inductor at a high precision is enabled by the use of the apparatus according to the present invention having a compression means including the mold. To be more specific, the method and apparatus according to the present invention enable a compression wherein the cavity and other parts of the substrate are compressed to a constant compression ratio, and wherein the interior of the cavity is formed simultaneously with the compression.

Next, the method for producing a multilayer ceramic substrate by using the apparatus of the present invention is described by referring to the drawings.

First, a green sheet laminate 1 as shown FIG. 1 is produced. This green sheet laminate can be formed by any method known in the art, and the necessary through holes and the through opening for the cavity are formed in the green sheet of predetermined thickness by using an appropriate means such as a punch or a drill. The green sheet is also provided with a predetermined pattern of the internal conductor, for example, by printing to thereby constitute a circuit of predetermined pattern and functional elements such as an inductor or a capacitor.

Next, the green sheets formed with the necessary through holes, cavity opening, and internal conductor pattern are stacked to form the green sheet laminate 1. The resulting green sheet laminate is placed under the compression means, namely, under a mold 10. This mold 10 has a projection 11 formed at the position corresponding to the cavity 2. It is to be noted, however, that the cavity is depicted in the drawings in an exaggerated manner for convenience of the explanation, and the size of the mold and the green laminate shown in the drawings is different from those actually used in practice.

Figure 2:
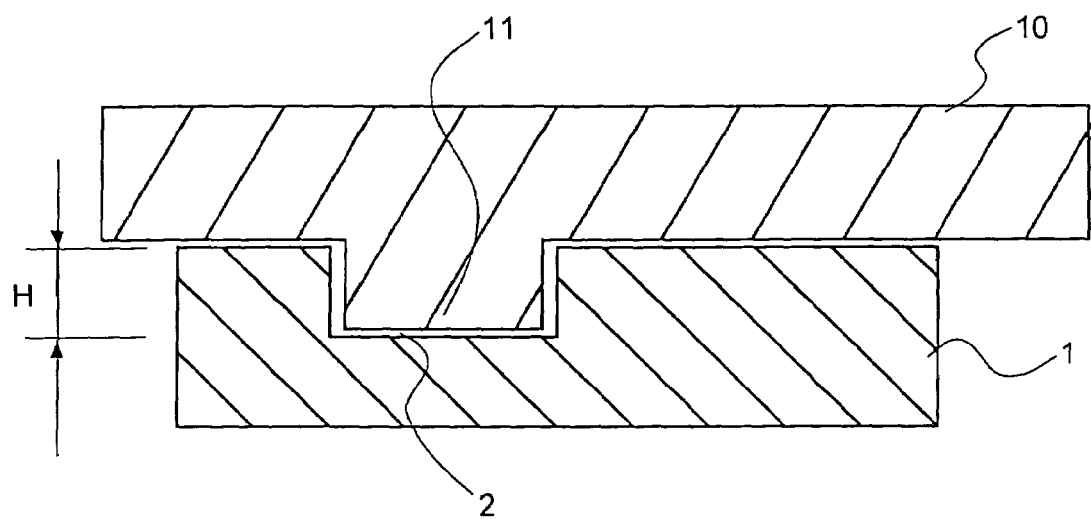
FIG. 2 is another cross sectional view showing the multilayer ceramic substrate according to an embodiment of the present invention in relation to the mold.

As shown in FIG. 2, the green sheet laminate 1 is thereafter compressed to the predetermined size by using the mold 10. The green sheets of the green laminate are thereby mutually adhered.

As shown in FIG. 2, the projection 11 formed on the mold 10 is designed to have a height which is equal to the depth H of the cavity 2 after the molding, namely, after the compression. In other words, the projection 11 has a height which is smaller than the depth D of the cavity 2 before the compression, and this design enables compression of the interior of the cavity 2 only after substantial compression of the laminate.

Since the projection is designed to have a height equal to the depth of the cavity after the molding, the interior of the cavity 2 can be compressed to a compression ratio substantially equal to that of other parts of the laminate, and this enables a production of the substrate having a consistent finishing quality after the firing, and provision of a high precision cavity as well as high precision capacitor and/or inductor formed by the internal conductor. In other words, in the method and the apparatus of the present invention wherein the interior of the cavity and other parts of the laminate are compressed to an identical compression ratio, the size required for the cavity as well as the capacitance and the inductance of the capacitor and/or the inductor formed by the internal conductor can be accurately calculated and realized on the bases of the known shrinkage ratio in the firing step.

To be more specific, the depth H of the cavity before the molding is represented by the equation:

$$H=D\times(1/(1-a/100))\times(1-b/100)-1/(1-b/100)+1)$$

when the cavity after firing has a depth D, shrinkage ratio in the firing is a%, and compression ratio of the laminate is b%.

Precision of the capacitance or the inductance of the capacitor, the inductor, or the capacitor and the inductor of the interior of multilayer substrate provided by the method and apparatus of the present invention is not particularly limited. The precision of the capacitor and/or the inductor realized, however, is preferably up to ±5%, and more preferably up to ±2%. The capacitance and the inductance of the capacitor and/or the inductor, which are not particularly limited, are generally in the range of about 0.1 to 50 pF and about 0.5 to 50 nH, respectively.

Because of such high precision, the capacitor and/or the inductor which had been provided as an outboard element in the conventional substrates can be formed by the internal conductor, and scale of integration can be greatly increased with great reduction in size and thickness of the resulting product. Formation of the capacitor and/or the inductor in the interior of the substrate also enables an arrangement wherein the capacitor and/or the inductor is located at a position nearer to the device, and frequency characteristics and other electric characteristics can be improved in a high frequency circuit by optimizing the grounding pattern.

In the method and apparatus of the present invention, it is also preferable that the gap or the clearance between the projection 11 and the side surfaces of the cavity 2 is adjusted to a predetermined range. Adjustment of the clearance between the projection 11 and the side surfaces of the cavity 2 to a predetermined range prevents the phenomenon that the side surfaces of the cavity become swollen or partially displaced from the proper position during the compression of the laminate. The clearance is preferably up to 60 μm, and more preferably up to 30 μm. The lower limit of the clearance is preferably about 5 μm in view of the dimensional accuracy in the positioning of the mold above the laminate.

When the interior of the cavity 2 is produced to a high precision with no surface irregularities, the electronic device mounted in the cavity 2 and the wiring pattern on the substrate can be connected at a minimized distance. Accordingly, increase of the impedance by the wiring (bonding wire) can be minimized to thereby improve electronic characteristics of the circuit.

In the present invention, the bottom of the cavity 2 can be smoothened to have a flatness, namely, to a surface roughness (surface irregularity) or waving of preferably up to 10 μm, and more preferably up to 5 μm. As a consequence, dimensional accuracy of the device mounted in the cavity in relation to the bottom surface of the cavity 2 can be improved, and a chip device can be mounted by bare chip packaging or flip chip packaging to thereby simplify the device packaging process and reduce the packaging area.

The present invention also contributes for the cost reduction since the cavity can be formed only by providing a projection on the compression mold and the production apparatus and process are very simple.

The multilayer ceramic substrate may further comprise a chip device mounted in the cavity. In such case, a pad electrode is usually formed on the surface on the opening side, and the chip device and the pad electrode are electrically connected by means of a bonding wire. The multilayer ceramic substrate produced by the present invention has a cavity with a very flat bottom surface, and the chip device may also be mounted by flip chip packaging. When the chip device is mounted by flip chip packaging, influence of the bonding wire can be excluded, and production of an electronic device having improved characteristics is thereby enabled.

Figure 3:
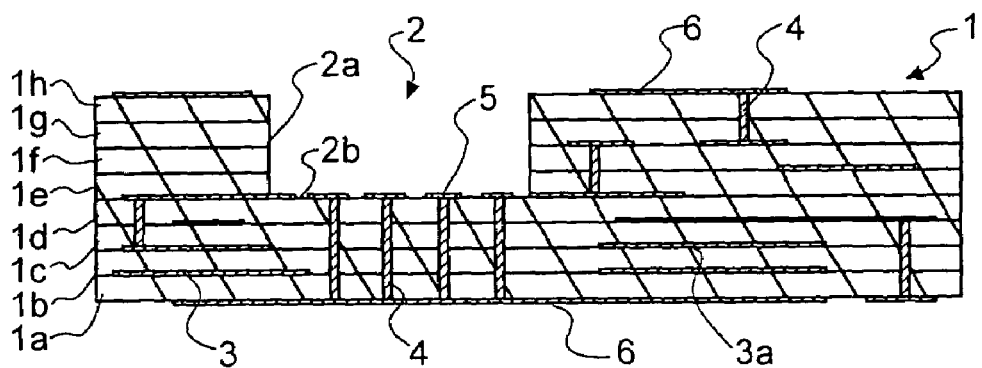
FIG. 3 is a cross sectional view of the multilayer ceramic substrate according to an embodiment of the present invention.
Figure 4:
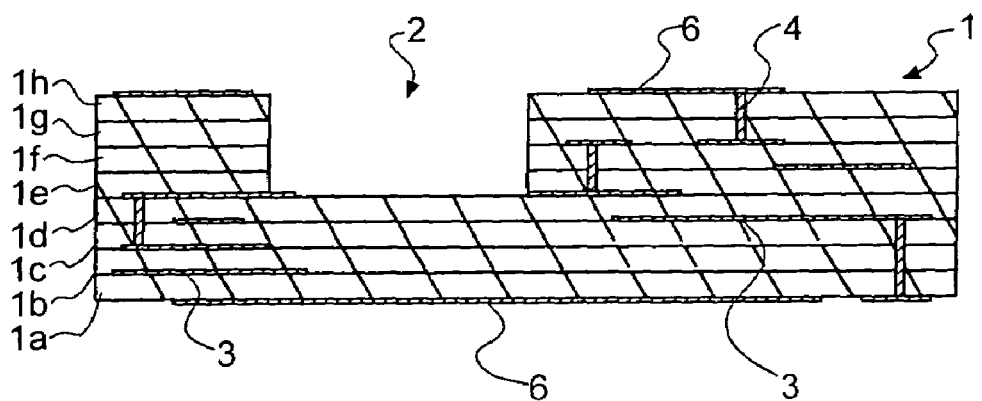
FIG. 4 is a cross sectional view of a conventional multilayer ceramic substrate.

FIG. 3 is a schematic cross sectional view of the multilayer ceramic substrate 1 according to an embodiment of the present invention.

In FIG. 3, the multilayer ceramic substrate 1 comprises a laminate comprising a plurality of ceramic layers 1a, 1b, 1c, 1d, 1e, 1f, 1g, and 1h stacked one on another. This laminate has end surfaces on opposite ends of the thickness direction, and the laminate is formed with a cavity 2 which opens at least to one end surface.

The laminate is also formed with conductor films between the predetermined layers of the ceramic layers 1a to 1h. Such conductor films include an external conductor film 6 formed on the end surface, an internal conductor film 3 formed between the predetermined layers of ceramic layer 1a to 1h, a via hole 4 formed to penetrate through the predetermined layers of ceramic layer 1a to 1h, and a pad electrode 5 formed on the bottom surface of the cavity 2.

These conductor films are formed, for example, by applying a conductive paste followed by firing, and such firing may be accomplished simultaneously with the firing whereby the laminate is obtained.

The cavity 2 is formed by the continuation of the through opening formed in each of the ceramic layers 1a to 1h, and in the embodiment shown in FIG. 3, the cavity 2 is formed substantially as a cavity 2 having a rectangular opening.

In the cavity 2 of the multilayer ceramic substrate 1 is accommodated a chip device such as a semiconductor IC chip (not shown), and this chip device is mounted on the pad electrode 5 formed on the bottom surface of the cavity 2 by flip chip packaging, and electrically connected to the internal conductor film 3 by the through hole 4.

The ceramic material used for the multilayer ceramic substrate of the present invention may be any of the known ceramic materials used for a substrate such as $Al_2O_3$, AlN, BeO, MgO, SiC, $BaSnB_2O_6$, $BaZrB_2O_6$, and glass-alumina-forsterite ternary system. However, the multilayer ceramic substrate of the present invention is preferably a substrate comprising a glass ceramic material which can be fired at a temperature of up to 1000° C., and preferably up to 950° C., which enables use of a low resistance metal such as Au, Ag, Ag—Pd, Ag—Pt, or Cu for the internal conductor.

Exemplary such substrate includes a low-temperature sinterable ceramic substrate comprising a mixture of glass powder and $Al_2O_3$ powder which can be sintered at 800 to 1000° C., and a glass ceramics containing $SiO_2$, $B_2O_3$, and $Al_2O_3$ as well as at least a member selected from Mg, Ca, Sr, and Ba as described in Japanese Patent Publication No. 3-53269 and other documents.

The circuit pattern is formed by a low resistance wiring conductor material, which is typically a metal material such as silver (Ag), silver-palladium (Ag—Pd), silver-platinum (Ag—Pt), gold (Au), or copper (Cu), among which silver (Ag) being the preferred. Use of such low resistance wiring material for the circuit enables production of a substrate which exhibits reduced time delay in signal transmission, reduced noise, and excellent adaptability for high frequency pulse, and hence, increased circuit signal transmission speed.

The green sheet formed with the circuit pattern or the laminate thereof is then fired at a temperature of up to 950° C., preferably up to 920° C., and most preferably at a temperature of about 870° C. to. 900° C., generally for approximately 15 minutes to 1 hour. When the temperature used for the firing is higher than the above-specified range, the low resistance, wiring conductor material which has a low melting point will be diffused, and when the firing temperature is too low, the resulting substrate will suffer from an unfavorable, excessively low sintered density as well as undesirably low conductor density.

The multilayer ceramic substrate of the present invention is typically used by mounting an electronic device in is cavity by bare chip packaging. However, a chip device, a chip composite, or the like may be mounted in the cavity by other means.

EXAMPLE

The material used for producing the substrate was a low temperature-firable, glass ceramic material which can be fired at a temperature of up to 950° C., and 59.6% by weight of this material was kneaded with 40.4% by weight of an acrylic resin binder. A green sheet having a thickness of 0.15 to 0.25 mm was produced from this mixture by using a doctor blade. Green sheets formed with a rectangular through opening of 1.53 mm×1.04 mm corresponding to the cavity and through holes at predetermined positions, and those with no such through opening for the cavity were prepared, and the green sheets with the cavity opening and the green sheets without such opening were stacked to constitute laminates each having a cavity of predetermined depth.

Figure 5:
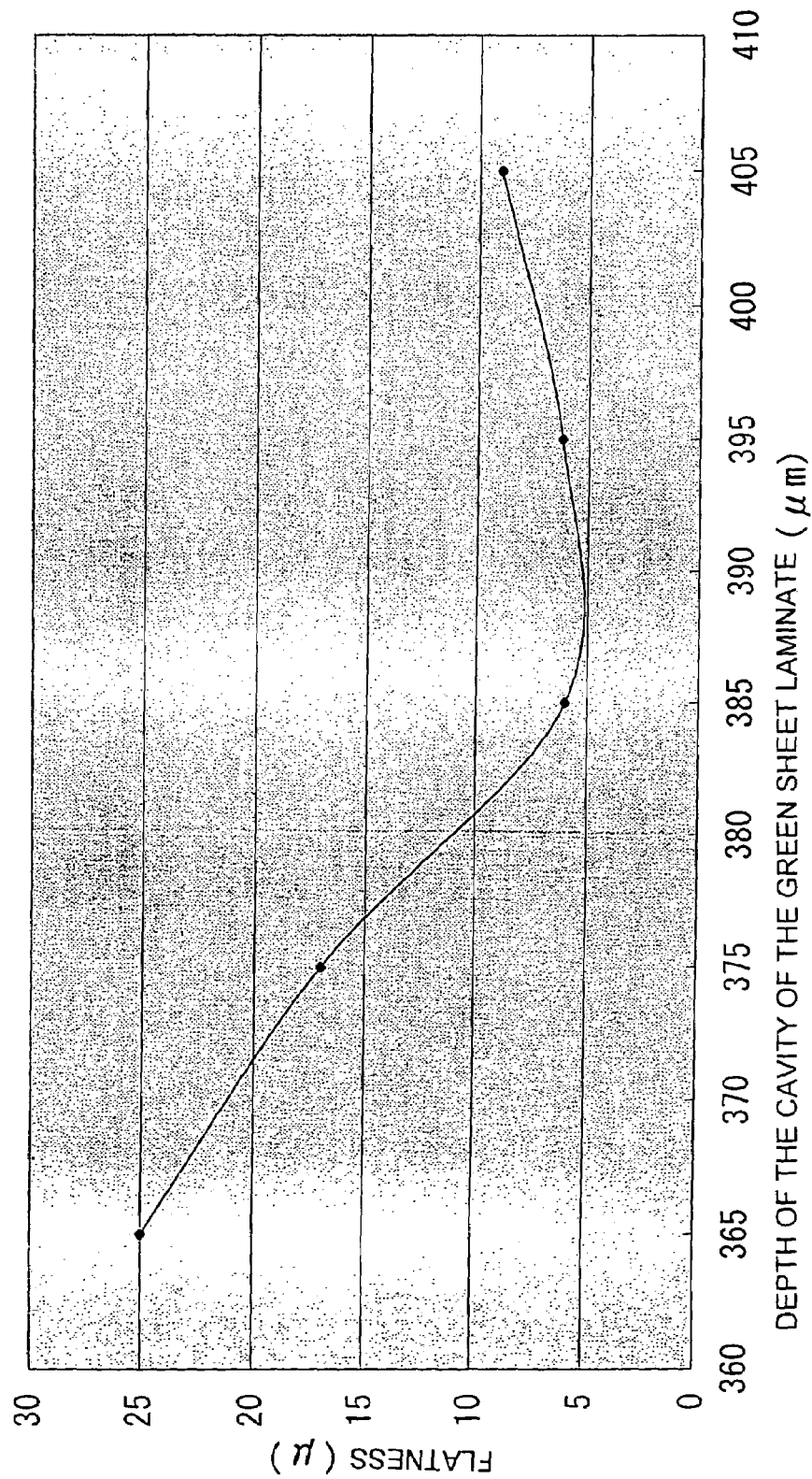
FIG. 5 is a graph showing flatness of the bottom of the cavity in relation to depth of the cavity formed in the green sheet laminate.

The resulting green sheet laminates having the cavity of various depths were compressed to a compression ratio of 18.3% by using a mold provided with a projection which had a length and a width 30 μm smaller than those of the cavity and which had a height of 315 μm. The bottom of the cavity of the compressed laminates was evaluated for its flatness. The results are shown in FIG. 5. In FIG. 5, the depth of the cavity before the compression of 388 μm corresponds to the depth of the cavity after the compression at a compression ratio of 18.3% of 315 μm. As shown in FIG. 5, the flatness was minimum when the depth of the cavity before the compression was in the range of approximately 385 to 390 μm.

Figure 6:
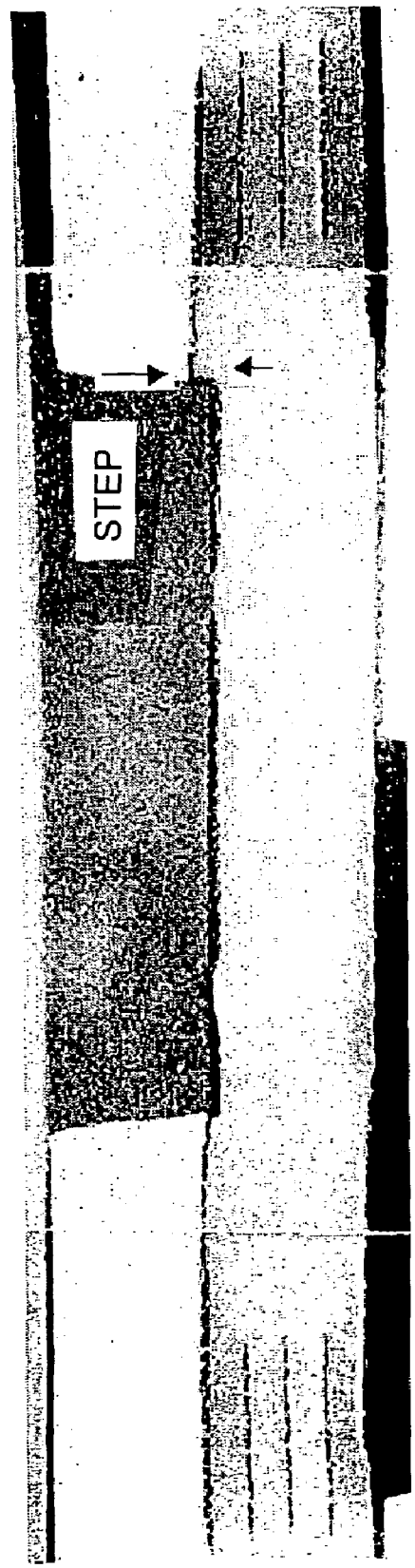
FIG. 6 is a photograph presented as a substitute for a drawing, and this photographs shows a cross section of the multilayer ceramic substrate and the step formed in the cavity of the multilayer ceramic substrate.

Next, clearance between the projection of the mold and the side surfaces of the cavity was varied, and the step in the cavity as shown in FIG. 6 was measured. The results are shown in FIG. 7.

Figure 7:
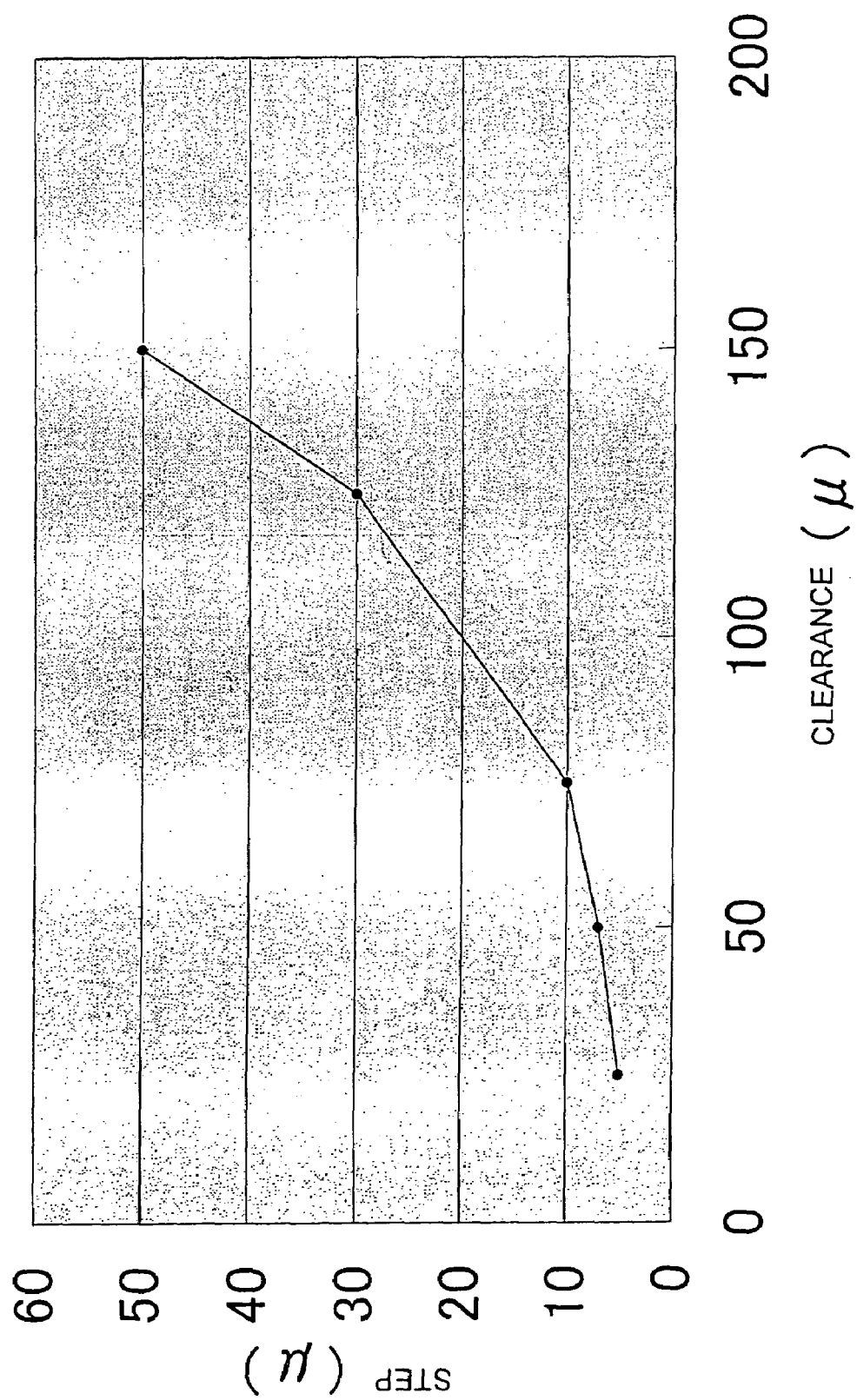
FIG. 7 is a graph wherein size of the step is depicted in relation to the clearance between the projection of the mold and the side surfaces of the cavity.

As shown in FIG. 7, the size of the step became significantly reduced when the clearance was 75 μm or less, and in particular, when the clearance was 50 μm or less.

A multilayer substrate formed with a cavity having a depth of 300 μm and a size of 1.40 mm×1.20 mm as shown in FIG. 3 was then produced by stacking green sheets having a thickness of 0.1 to 0.2 mm. This substrate also had a capacitor of 25 pF constituted by the conductor films formed between the green sheets. A pad for flip chip packaging was also formed in the interior of the cavity, and this pad was connected to the internal conductor by a through hole.

When 100 samples produced by the procedure as described above were measured for their capacitance, precision of the capacitance was within ±2%. When a bare electronic device (SAW filter) was mounted on the chip-packaging pad by flip chip packaging, the bare SAW filter could be mounted with no trouble, and faulty connection of the pad was observed in none of the samples.

MERITS OF THE INVENTION

As described above, the present invention has enabled to produce a multilayer ceramic substrate which has a consistent quality, which has no swelling or collapse in the inner periphery of the cavity, wherein the bottom of the cavity is flat to enable stable packaging of the desired device at a high precision, and wherein L and C can be formed by the internal conductor at a high precision.

In addition, the present invention has realized a method for producing a multilayer ceramic substrate and an apparatus therefor by which a multilayer ceramic substrate can be readily produced in a simple procedure by using an apparatus of simple structure.

The invention claimed is:

1. A method for producing a multilayer ceramic substrate having a cavity formed therein, comprising:
   punching a through opening corresponding to the cavity in green sheets constituting a laminate, and printing a conductor at a predetermined position of the green sheets, and then laminating the green sheets to constitute a green sheet laminate; and
   applying a pressure of 30 to 150 MPa to the green sheet laminate by using a compression member having a projection at a position corresponding to said cavity to thereby compress the green sheet laminate, wherein:
   said projection has a height which is equal to the depth of the cavity multiplied by compression ratio of the green sheet laminate,
   a clearance between the projection and side surfaces of said cavity is from 5 μm to 60 μm, and
   the green sheet laminate is compressed by applying the pressure such that compression ratio of the bottom of the cavity is identical with the compression ratio of other parts of the green sheet laminate.

2. A method for producing a multilayer ceramic substrate according to claim 1 wherein the cavity before the compression has a depth H represented by the equation:

$$H = D \times (1/(1-a/100) \times (1-b/100) - 1/(1-b/100) + 1)$$

when the cavity after firing has a depth D, shrinkage ratio in the firing is a%, and compression ratio of the laminate is b%.

* * * * *